United States Patent

Parekh et al.

Patent Number: 5,556,507
Date of Patent: Sep. 17, 1996

[54] MULTIFUNCTIONAL CONTACTLESS INTERCONNECT TECHNOLOGY

[75] Inventors: Nitin Parekh, Los Altos; Dominic Massetti, Scotts Valley, both of Calif.

[73] Assignee: Silicon Systems, Inc., Tustin, Calif.

[21] Appl. No.: 206,444

[22] Filed: Mar. 3, 1994

[51] Int. Cl.⁶ .................................................. H01L 21/00
[52] U.S. Cl. ........................... 156/656.1; 156/659.11; 437/228; 437/245; 437/246
[58] Field of Search ........................... 156/656.1, 659.11; 437/245, 246, 228

[56] References Cited

U.S. PATENT DOCUMENTS

| | | | |
|---|---|---|---|
| 4,267,012 | 5/1981 | Pierce et al. | 156/656.1 X |
| 4,744,861 | 5/1988 | Matsunaga et al. | 156/656.1 X |
| 4,948,462 | 8/1990 | Rossen | 156/656.1 X |
| 5,108,542 | 4/1992 | Lin | 156/656.1 X |

*Primary Examiner*—Thi Dang
*Attorney, Agent, or Firm*—Hecker & Harriman

[57] ABSTRACT

The present invention is a method for providing multifunctional, contactless, interconnect technology that can simultaneously fabricate four features on a silicon wafer within the same metallization level including a diffusion barrier layer, a trim element (fuse), a higher resistivity local interconnect/strap, and a lower resistivity global interconnect. The fabrication only requires two lithographic operations and one metal deposition. A first metal (a refractory metal) film having constant thickness is sputter deposited on the silicon wafer. In the preferred embodiment, the refractory metal is titanitun-tungsten. A second metal fihn may be sputter deposited on the first metal film. The first metal fihn has a higher resistivity than the second metal film. In the preferred embodiment, the second metal is aluminum-copper. Four features may be defined using a first mask. The features are etched and the first mask is removed. Three of the four features may be further defined using a second, non-critical mask. The second metal film of the three features are wet etched and the second mask is removed to provide the four features. An intermetal oxide is deposited. The present invention maintains good barrier integrity, even as devices are scaled down into the submicron and sub-half micron regimes.

70 Claims, 12 Drawing Sheets

MULTIFUNCTIONAL CONTACTLESS INTERCONNECT TECHNOLOGY

BACKGROUND OF THE INVENTION

1. Field of the Invention

The present invention is related to the field of fabricating semiconductor devices.

2. Background Art

As semiconductor devices are scaled into the submicron and sub-half micron regimes, interconnect contacts become increasingly important in the overall performance of the semiconductor devices. Further, it is necessary to reduce the number of metallization steps comprising critical lithographic operations to fabricate the semiconductor devices. Critical lithographic steps are those that have more critical dimensional tolerances than noncritical lithographic steps. Low sheet resistance values are important for interconnect materials in order to reduce propagation delays and minimize voltage drops along interconnects. It is particularly important to reduce propagation delays due to the resistance and capacitance of interconnects as devices are scaled into the submicron regime. For small feature designs comprising dense, high performance devices, propagation delays along interconnects may exceed gate switching delays in metal-oxide semiconductor (MOS) devices. Contacts coupling metal and polysilicon and active silicon areas increasingly affect the overall resistivity of interconnects as semiconductor devices are scaled down into the submicron and sub-half micron regimes.

Silicides are used to reduce the interconnect resistance of metal with polysilicon and active silicon areas, i.e., the gate and source/drain of MOS devices, respectively. Silicides are compounds formed from silicon and refractory metals that exhibit significantly lower resistance than the sheet resistances of polysilicon and shallow diffusions. Silicides are produced by reacting refractory metal with exposed active silicon areas and polysilicon areas. The silicide provides a much lower contact interface between metal and the active silicon and polysilicon areas than regular metal/polysilicon and metal/silicon interfaces.

Commonly, aluminum-copper (AlCu) is used in silicon technologies for metal interconnects because of its low resistivity. However, AlCu has a number of problems forming contacts with silicides including aluminum spiking and junction penetration, as is well-known in the art. Barrier layers are used to eliminate these problems by preventing silicon diffusion. To prevent barrier spiking, diffusion barrier layers are deposited on the silicide before metallization. Materials such as titanium-tungsten (TiW) are used as barrier layers over silicides in a contact region. However, the prior art is not able to efficiently fabricate a diffusion barrier layer on polysilicon, polysilicon bilayers, and/or monosilicon layers in the submicron/sub half-micron regime. The polysilicon bilayers are structures containing polysilicon and tungsten silicide (WSi$_2$), for instance, as is well-known in the art. While polysilicon bilayers with WSi$_2$ are described, it should be apparent to a person skilled in the art that other layers may also be used in combination with polysilicon. The barrier layers may then be subsequently deposited. Additionally, layers including aluminum, aluminum alloy, tungsten, etc., are deposited on top of the barrier layers.

FIG. 1 is a prior art diagram illustrating a MOS transistor including a polysilicon area after silicidation. The device comprises a source including a doped region 112 and silicide layer 114, a gate including polysilicon layer 118 and silicide layer 120, and a drain including a doped region 122 and silicide 124. The active regions 112 and 122 may be donor doped n+ or acceptor doped p+ for NMOS or PMOS devices. For example, in FIG. 1, the active silicon regions 112 and 122 are donor doped n+ regions. The polysilicon 118 is isolated from n+ regions 122 and 112 by spacers 116A and 116B. The oxide spacers 116A and 116B prevent silicide formation on the sides of polysilicon layer 118. The transistor is isolated from other semiconductor devices by field oxides 110 and 126.

After the polysilicon is patterned (see FIG. 1), the prior art begins by depositing an isolation layer using a dielectric on the polysilicon. The isolation layer is then patterned where metal (e.g., AlCu) is to contact polysilicon using a contact mask. FIG. 2 is a prior art diagram illustrating a contact aperture 220 formed in dielectric layer 202 for polysilicon layer 118 of FIG. 1. The diagram of FIG. 2 provides an expanded diagram of the gate region of FIG. 1 illustrating two dimensions of the three-dimensional contact aperture 220. The contact aperture 220 has depth H into the dielectric layer 202 and width W. Silicide layer 120 forms the bottom surface of the contact aperture 220. Contacts may be similarly formed on doped regions 112 and 122.

Once the contact aperture 220 is etched open into the isolation layer 202, the prior art sputter deposits a metal film 310 to form a barrier layer 302 in the submicron contact aperture 220. FIG. 3 is a prior art diagram illustrating the sputter deposition of metal film 310 to form barrier layer 302 on the silicide region 120 of polysilicon 118. As illustrated in FIG. 3, the metal film is deposited on dielectric layer 202 as well. Variations in the thickness of metal film 310, especially in the contact aperture 220, are described in detail below. Barrier layers may be similarly formed on doped regions 112 and 122.

FIG. 4 is a prior art diagram illustrating the subsequent deposition of AlCu metal 402 onto metal film 310 and into contact aperture 220. The AlCu metal 402 is deposited on the barrier layer 302 filling the contact aperture 220. As described above, the diffusion barrier layer 302 functions to reduce aluminum spiking and junction penetration between the AlCu metal 402 and the polysilicon layer 118. However, in submicron geometries of the contact aperture 220, a number of problems arise due to the dimensions of the contact aperture 220.

In the prior art, the barrier layer 302 is sputter deposited after the formation of the contact 220 (illustrated in FIG. 3). Thus, problems arise due to poor step coverage because the thickness H of the dielectric layer 202 remains constant (i.e., the depth H of the contact aperture 220 through the dielectric 202 is fixed) whereas the other dimensions of the contact are reduced (e.g., the width W of contact aperture is reduced) into the submicron regime.

FIG. 5A is a diagram illustrating a prior art disadvantage of sputter depositing metal film 310 in contact aperture 220 to form barrier layer 302 on silicide layer 120. The thickness of the metal film 310 sputter deposited within contact aperture 220 to form barrier layer 302 is adversely affected by the smaller geometry sizes of the contact aperture 220 with respect to the nominal thickness T of the metal film 310 on a flat surface (e.g., top surface of dielectric layer 202). This produces poor step coverage because the aspect ratio increases in the submicron regime. Consequently, it is difficult to produce a uniform barrier layer thickness by sputter depositing the metal film 310 in the contact aperture 220. As illustrated in FIG. 5A, the thickness T' of barrier layer 302 contacting silicide layer 120 bulges in the center of the contact aperture 220, i.e., at location W'/2. In contrast, the thickness T" of barrier layer 302 contacting silicide layer 120 near the sides of contact aperture 220 in the dielectric layer 202 narrows significantly. The step coverage is also affected by the slope of the dielectric layer walls and the shape of the contact aperture. Poor step coverage results in loss of barrier integrity, which is a severe reliability problem for metallization. The varying thickness of the barrier layer 302 causes the barrier layer 302 to be less effective preventing diffusion at thickness T" and produces an undesired increase in resistance at thickness T'.

For example, referring to FIG. 5A, a desired film thickness T of 1000 angstroms (Å) for barrier layer 302 is deposited, as illustrated on the top surface of dielectric layer 202. However, due to poor step coverage, tile thickness T' of barrier layer 302 is equal to 1200 Å in the center of the contact aperture 220 whereas the thickness T" at the edges of the contact aperture 220 pinches to 300 Å.

Further still, referring to FIG. 5B, sputter depositing the barrier layer 302 may effectively close-off the contact aperture 220 in the submicron regime, creating a void in the dielectric layer 202. This is caused by shadowing effects when the aperture 220 is too deep relative to its other dimensions.

Prior art methods have attempted to improve the integrity of the barrier layer 302 since barrier integrity is a major reliability problem for metallization.

In another prior art method, collimated sputtering is the used to improve barrier integrity into the submicron regime. Collimated sputtering results in sputtering efficiencies on the order of 10%–20% of those of conventional means, thereby posing a severe trade-off with throughput. However, even with this method, the prior art is unlikely to be able to maintain barrier integrity into the sub-half micron regime.

In yet another prior art method, chemical vapor deposition (CVD) is use to improve barrier integrity. However, CVD applications such as selective tungsten (W) require the sputter deposition of a nucleating seed layer for contact fill. The nucleating seed layer is necessary in order for the subsequent CVD tungsten layer to adhere to the silicide layer 120. Thus, this prior art method requires deposition of a nucleating seed layer having the disadvantages of a metal film discussed with reference to FIGS. 5A and 5B. Thus, this prior art method has severe problems in the submicron and sub-half micron regime as well. To circumvent this problem, the prior art attempts to deposit a CVD seed layer in the contact adding to the cost of the manufacturing sequence.

In addition to disadvantages in poor barrier layer integrity, the prior art requires extra metallization processing steps. Metallization is used to fabricate both global and local interconnects on semiconductor circuits. Global interconnects cover large distances on a semiconductor chip connecting widely separated regions, thereby requiring low resistivity to reduce voltage drops and propagation delay due to the long interconnect lengths. Local interconnects cover shorter distances between devices in a particular region of a semiconductor chip and, therefore, may have higher resistivity. Straps are short interconnects formed by metallization. Metallization is also used to form trim elements including fuses, as is well-known in the art.

In the prior art, a trim element (fuse), a higher resistivity local interconnect/strap, and a lower resistivity global interconnect are fabricated in two metallization levels separated by an inter-level dielectric. The prior art requires at least two separate metallization depositions and three lithographic operations. Thus, while a trim element (fuse), a higher resistivity local interconnect/strap, and a lower resistivity global interconnect have been fabricated in the prior art, the features have not been fabricated in the same metallization layer.

Thus, a number of disadvantages exist in the prior art. A disadvantage of the prior art is that the barrier integrity performance is poor into the submicron regime. The prior art methods for achieving barrier integrity into the submicron/sub-half micron regime require the purchase of new equipment or additional hardware for existing equipment.

Another disadvantage of the prior art for applications such as selective tungsten (W) is the deposition of a nucleating seed layer for contact fill. The prior art has severe problems in the submicron and sub-half micron regime.

A further disadvantage of prior art for fabricating trim elements, higher resistivity local interconnects/straps, and lower resistivity global interconnects is that these three features require lithographic performance at the limit of available technology on two levels. In addition, the prior art requires the use of an additional metallization/dielectric level. While the prior art uses one or at most two of these features in their technologies, all three features have not been provided in one metallization technology.

SUMMARY OF THE PRESENT INVENTION

The present invention is a method for providing multifuncti6nal, contactless, interconnect technology that can simultaneously fabricate four metallization features. The fabrication only requires two lithographic operations and one metal deposition. The four features that may be formed within the same metallization levol include a diffusion barrier layer, a trim element (fuse), a higher resistivity local interconnect/strap, and a lower resistivity global interconnect.

The present invention fabricates the features on a silicon wafer or substrate that may include polysilicon layers, polysilicon bilayers, and monosilicon layers. The features may be fabricated after silicidation of the silicon wafer. A first metal film having constant thickness T is deposited on the silicon wafer. The first metal is a refractory metal that is titanium-tungsten in the preferred embodiment. A second metal film may be deposited on the first metal film. Tile first metal film has a higher resistivity than the second metal film. In the preferred embodiment, the second metal is aluminum-copper. M features are defined using a first mask. The M features are etched and the first mask is removed. N of the M features may be defined using a second, non-critical mask, where N≦M. The second metal fihn of the N features are etched and the second mask is removed to provide the M features, N of which have been modified. The N features include a layer of the first metal formed on the polysilicon layer by the first mask, a trim means, a higher resistivity interconnect means, and M–N lower resistivity interconnect means. An intermetal oxide is deposited.

The present invention maintains good barrier integrity, even as devices are scaled down into the submicron and sub-half micron regimes. It provides the possibility of a trim element, whereas other local interconnect technologies ($TiSi_2$ or TiN) cannot act as trim elements. The present invention further provides area reduction by allowing overlapping contacts (extension of active area onto field oxide) and by forming contacts from polysilicon to both n+ and p+ active areas. The present invention for forming barrier layers permits the use of existing equipment, well into the sub-half micron regime, to maintain good barrier integrity without purchasing new or additional equipment. Further, fabrication of trim elements, local interconnects, and global interconnects only requires one critical lithographic operation.

DETAILED DESCRIPTION OF THE PRESENT INVENTION

A method for providing multifunctional, contactless interconnect technology is described. In the following description, numerous specific details, such as number and nature of polysilicon layers, interconnects, etc., are described in detail in order to provide a more thorough description of the present invention. It will be apparent, however, to one skilled in the art, that the present invention may be practiced without these specific details. In other instances, well-known features have not been described in detail so as not to unnecessarily obscure the present invention.

The present invention simultaneously fabricates four semiconductor device features: a diffusion barrier layer on polysilicon, polysilicon bilayers, and/or monosilicon, a trim element (fuse), a higher resistivity local interconnect/strap, and a lower resistivity global interconnect. The four features are formed within the same metallization level, thereby providing enhanced design freedom. The fabrication only requires two lithographic operations and one metal deposition.

Figure 1:
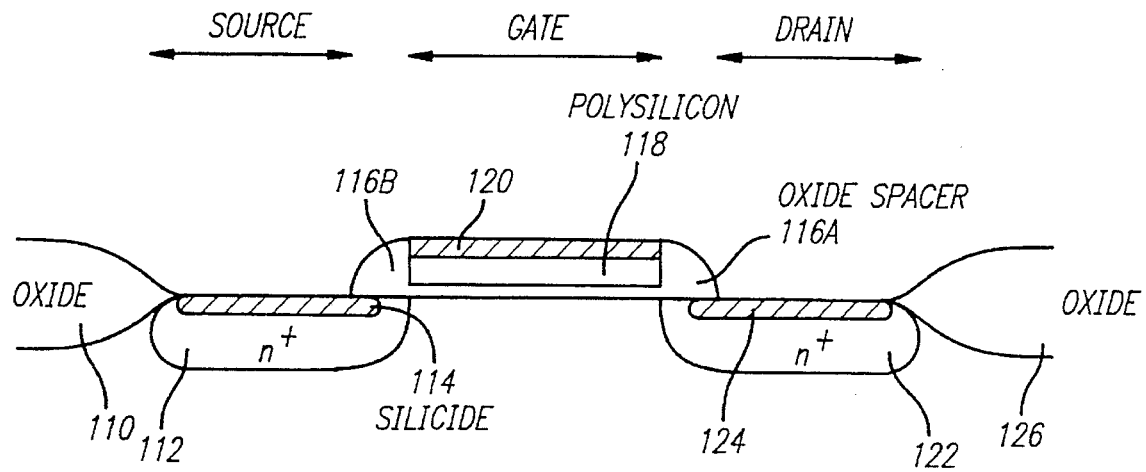
FIG. 1 is a prior art diagram illustrating a MOS transistor including a polysilicon area after silicidation.
Figure 2:
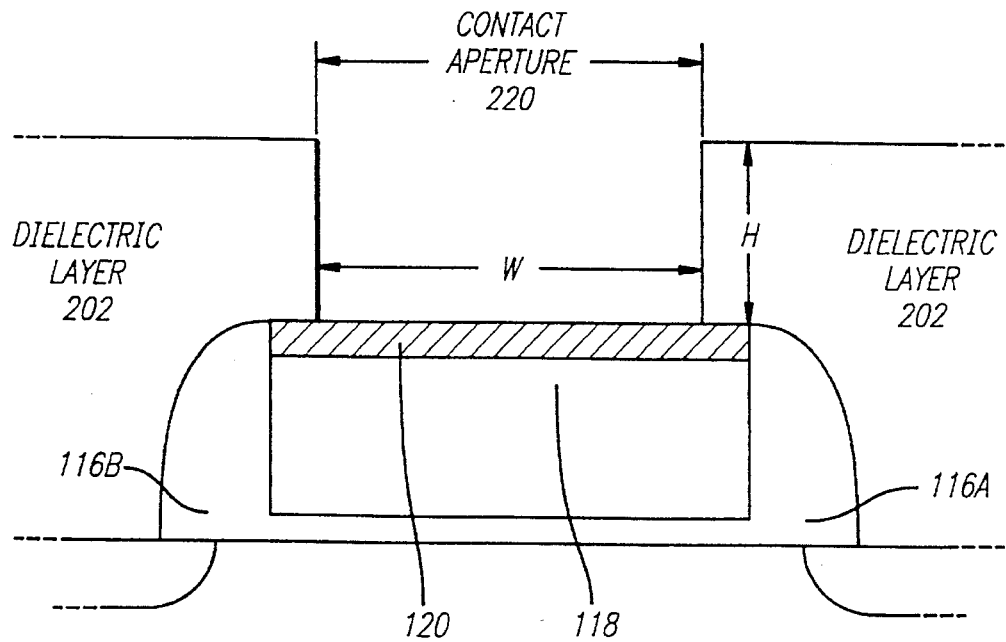
FIG. 2 is a prior art diagram illustrating a contact aperture formed in a dielectric layer for the polysilicon layer of FIG. 1.
Figure 3:
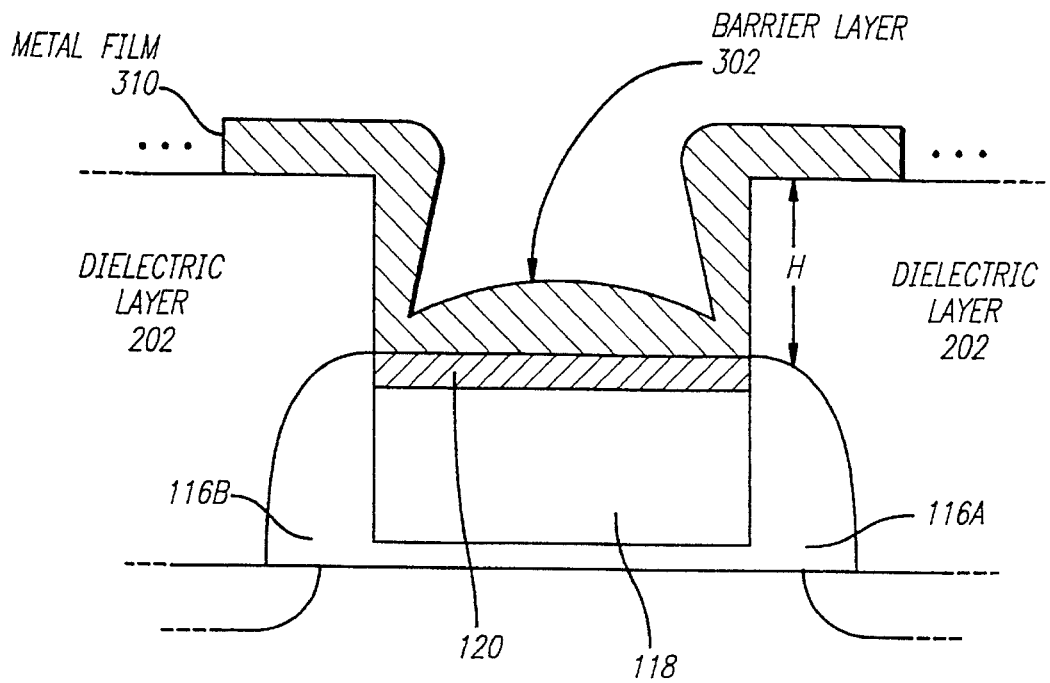
FIG. 3 is a prior art diagram illustrating sputter deposition of metal film forming a barrier layer on the silicide region of the polysilicon layer.
Figure 4:
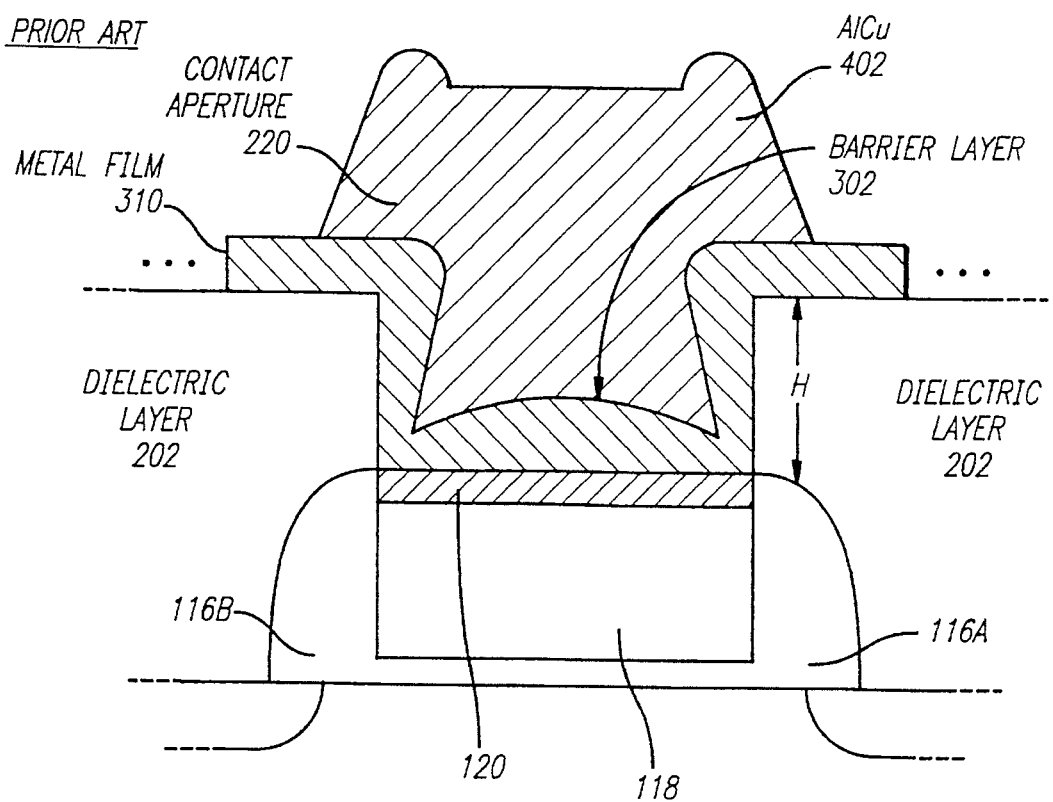
FIG. 4 is a prior art diagram illustrating the deposition of interconnect metal onto the barrier layer in the contact aperture.
Figure 5A:
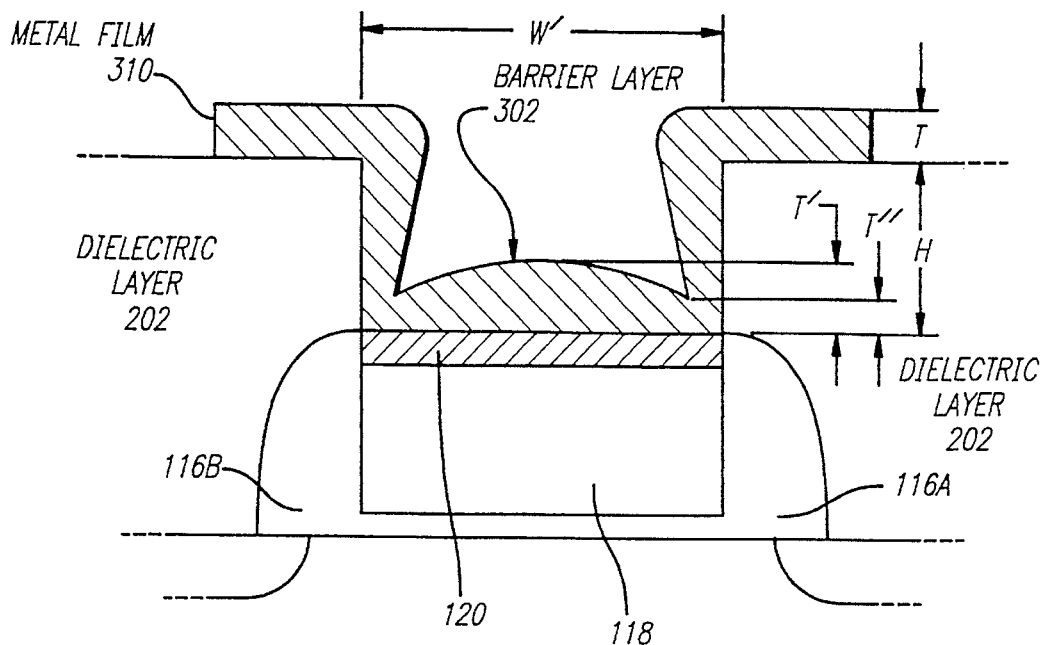
FIGS. 5A and 5B are diagrams illustrating prior art disadvantages of sputter depositing barrier layers into the contact aperture.
Figure 5B:
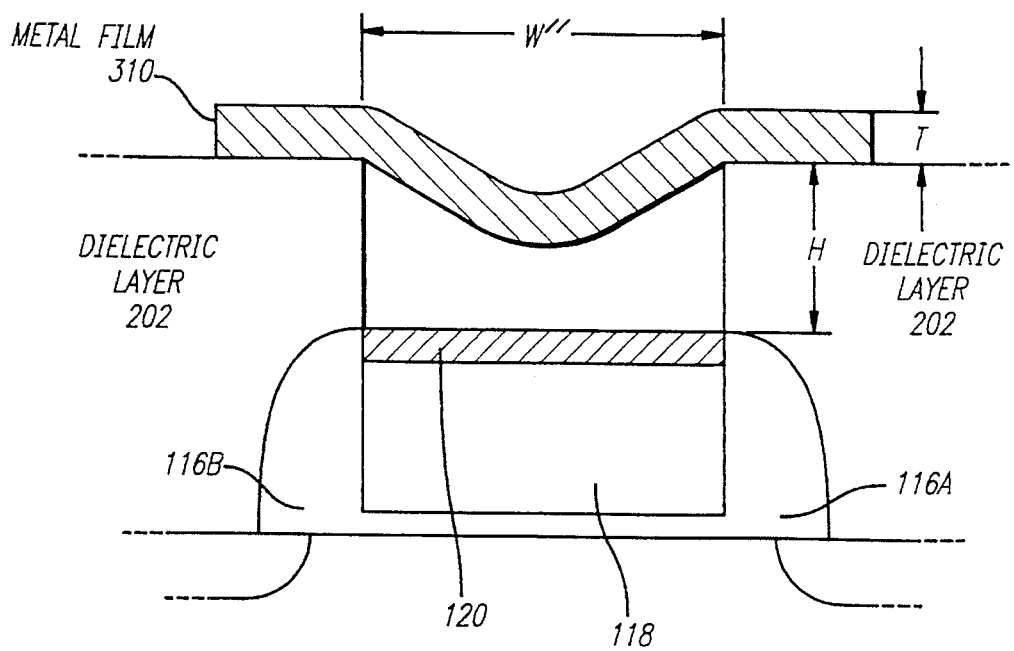
Figure 6:
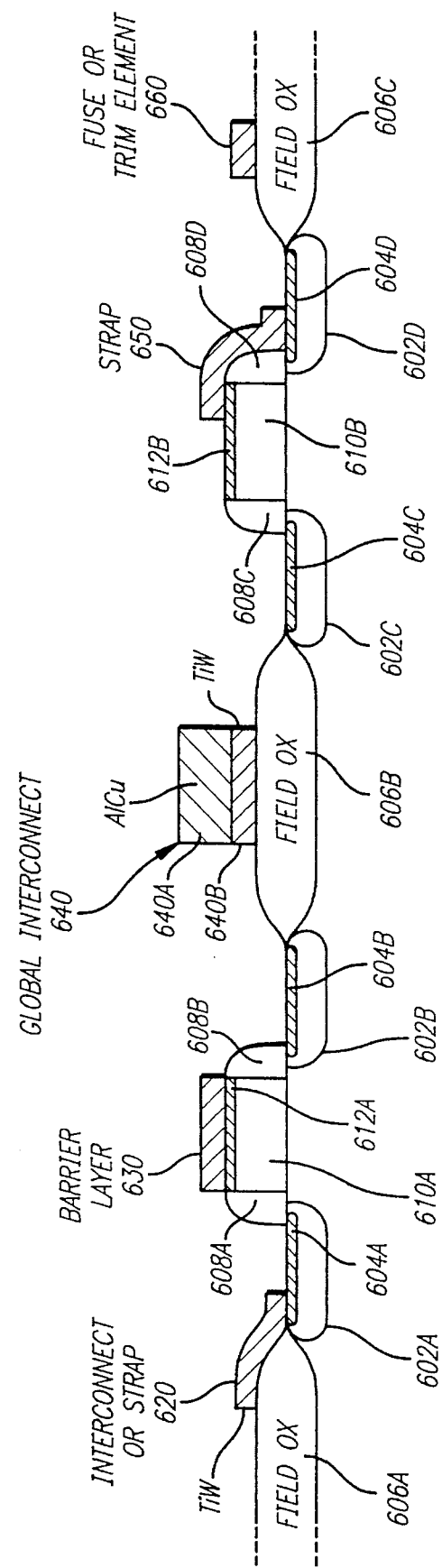
FIG. 6 is a diagram illustrating a barrier layer deposited on a polysilicon layer, a local interconnect/strap, a global interconnect, and a fuse/trim element fabricated in a single metallization technology according to the present invention.

FIG. 6 is a diagram illustrating the semiconductor device features that are fabricated in a single metallization step according to the present invention. The diagram illustrates active silicon areas 602A–602D including silicide layers 604A–604D, respectively. A first gate structure includes polysilicon layer 610A and silicide layer 612A. The polysilicon layer 610A and silicide layer 612A are isolated from active silicon areas 602A/604A and 602B/604B by oxide spacers 608A and 608B, respectively. Similarly, a second gate structure includes polysilicon layer 610B and silicide layer 612B isolated by oxide spacers 608C and 608D. The diagram further includes three field oxide layers 606A–606C. Field oxide 606B separates the two active devices described above.

Figure 14:
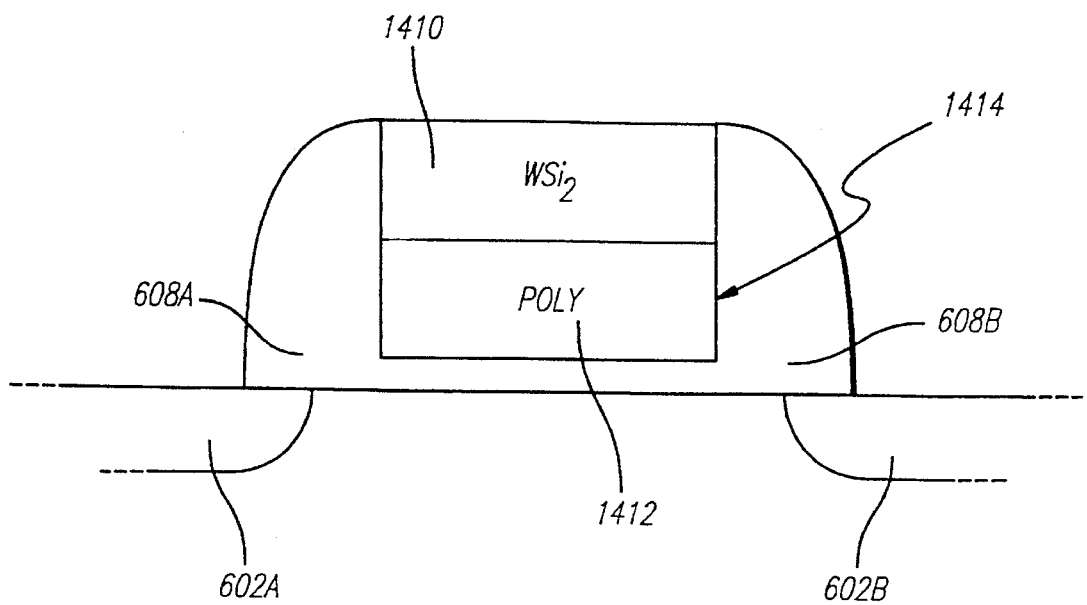
FIG. 14 is a diagram illustrating a prior art polysilicon bilayer.

FIG. 6 illustrates the four device features fabricated in a single metallization technology comprising a local interconnect/strap 620 and strap 650, a barrier layer 630 deposited on a polysilicon layer 610A, a global interconnect 640, and a fuse/trim element 660. In the preferred embodiment of the present invention, titanium-tungsten (TiW) is the refractory metal used to form the local interconnect/strap 620 and strap 650, barrier layer 630 and fuse/trim element 660. The global interconnect 640 is also formed from a layer of TiW 640B for a barrier layer and a layer of AlCu 640A deposited on top. Local interconnect/strap 620 overlaps field oxide 606A and active silicon/silicide area 602A/604A. Barrier layer 630 is deposited on polysilicon layer 610A including silicide layer 612A. Global interconnect 640 is fabricated on field oxide 606B. Strap 650 overlaps active silicon/silicide area 602D/604D, oxide spacer 608D, and polysilicon layer 610B including silicide layer 612B. To simplify the drawings, FIG. 6 illustrates barrier layers on the polysilicon layers. Alternatively, polysilicon layers 610A–610B may comprise polysilicon bilayers. FIG. 14 is a diagram illustrating a prior art polysilicon bilayer 1414 comprising polysilicon layer 1412 and tungsten silicide layer 1410. The structure of FIG. 14 may used as a gate in place of the polysilicon layer 610A, for example. It should be apparent to a person skilled in the art that the barrier layers may be formed on monosilicon layers and/or polysilicon bilayers. Further, while the present invention is described having polysilicon and monosilicon layers that include silicide layers, it should be apparent to person skilled in the art that the present invention may be practiced without the silicide layers.

DETAILED DIAGRAMS OF THE PRESENT INVENTION

Figure 12:
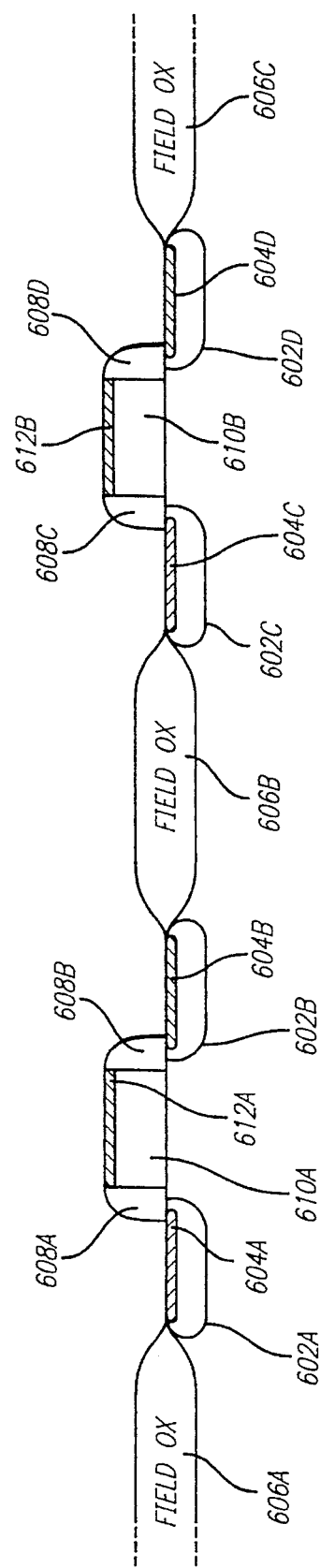
FIG. 12 is a prior art diagram illustrating semiconductor devices after silicidation is performed.
Figure 13:
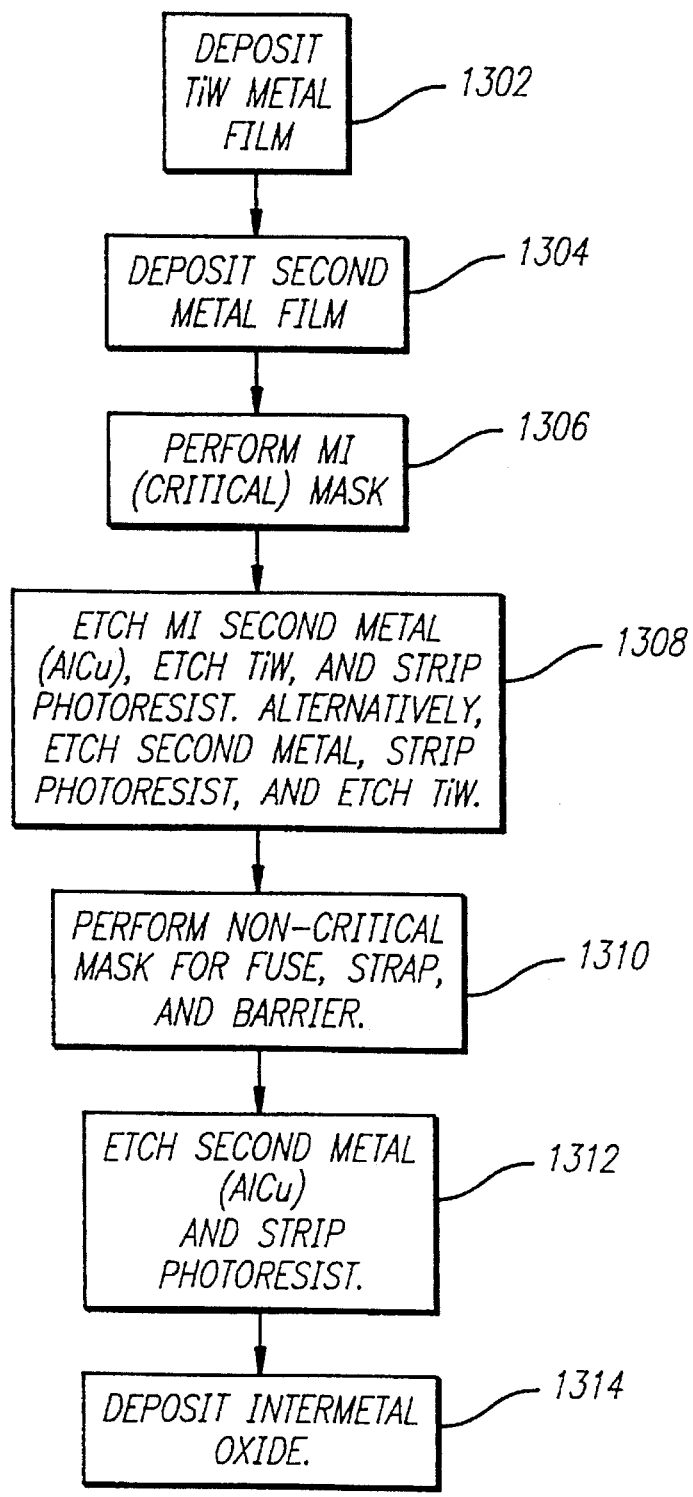
FIG. 13 is a flow diagram illustrating the steps of the present invention.

FIG. 13 is a diagram illustrating the steps 1302–1314 of the present invention for providing a multifunctional, contactless interconnect technology. Prior to the process of the present invention, semiconductor devices are formed and silicidation is performed, as illustrated in FIG. 12. Processing begins at step 1302. In step 1302, a titanium-tungsten (TiW) is deposited. In step 1304, a second metal (e.g., aluminum-copper AlCu in the preferred embodiment) is deposited on the film of TiW. In the preferred embodiment of the present invention, both metal films are deposited using sputter deposition. Further, in addition to AlCu, other metals including aluminum alloy, tungsten, etc., may be used for the second metal layer (i.e., the metal 1 layer). In step 1306, the MI mask is performed. This step comprises applying a first photoresist layer on the second metal layer; exposing a pattern on the photoresist layer using a mask; and developing the photoresist. The MI mask is a critical mask that defines barrier layers, fuses/trim elements, local interconnects/straps, and global interconnects. In step 1308, the features comprising the second metal (AlCu) and TiW of the MI mask are defined using etching and photoresist stripping. The metal etching and photoresist stripping steps may be performed in different sequences. For instance, in an exemplary process, the second metal is etched, the photoresist is stripped, and then TiW metal is etched. In another exemplary process, the second metal is etched, the TiW is etched, and then the photoresist is stripped. In step 1310, a non-critical mask is performed for fuses/trim elements, local interconnects/straps, and barrier layers. In step 1312, the second metal is etched, and the photoresist stripped. In step 1314, intermetal oxide is deposited. Steps 1302–1312 of the present invention may be inserted in a generic process flow to obtain the benefits of the four features.

FIGS. 6–12 are detailed diagrams illustrating the present invention for providing barrier layers, local interconnects/straps, global interconnects, and fuse/trim elements in a single metallization technology. As described above, FIG. 12 illustrates semiconductor devices after silicidation is performed comprising active silicon areas 602A–602D and corresponding silicide layers 604A–604D, field oxides 606A–606C, and polysilicon layers 610A–610B and corresponding silicide layers 612A–612B as well as spacers 608A–608B and 608C–608D. Barrier layers may be formed on polysilicon layers 610A and 610B or monosilicon areas 602A–602D or both. To simplify the drawings, formation of barrier layers is only illustrated on polysilicon layers. However, it should be apparent to a person skilled in the art that the present invention may be used to fabricate barrier layers on monosilicon (or crystalline silicon) areas.

Figure 7:
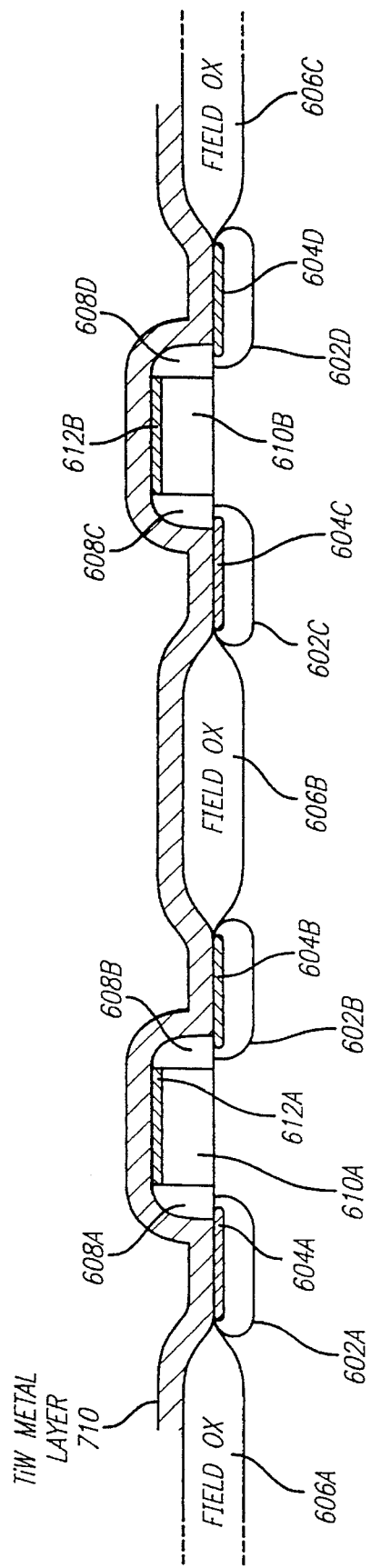
FIG. 7 is a diagram illustrating sputter deposition of a TiW metal film on the device features of FIG. 12 according to the present invention.
Figure 8:
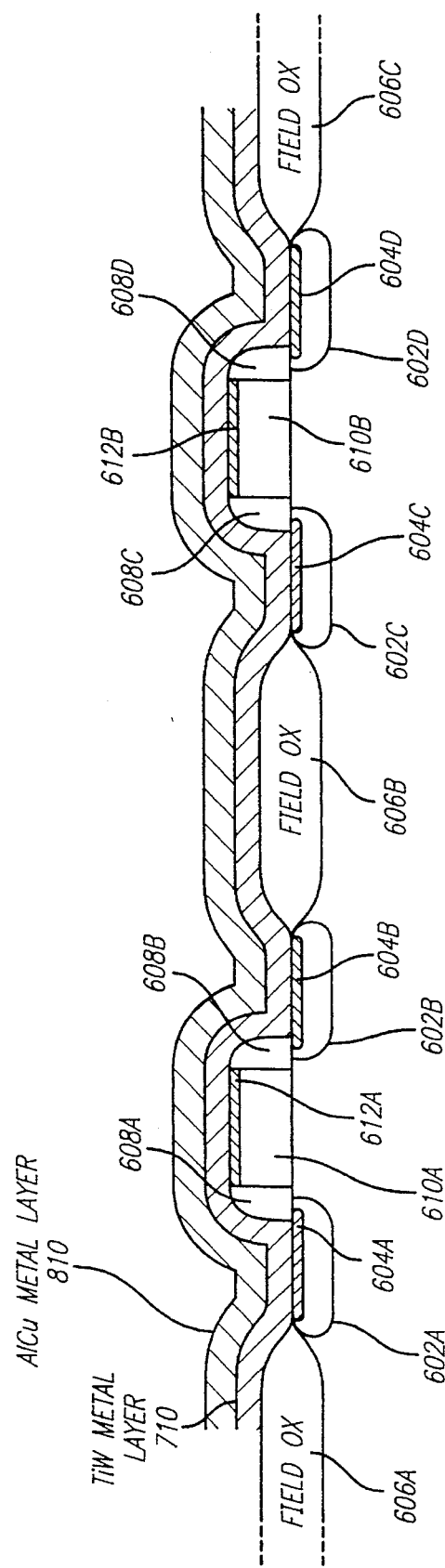
FIG. 8 is a diagram illustrating sputter deposition of an AlCu metal film on the TiW metal layer according to the present invention.
Figure 9:
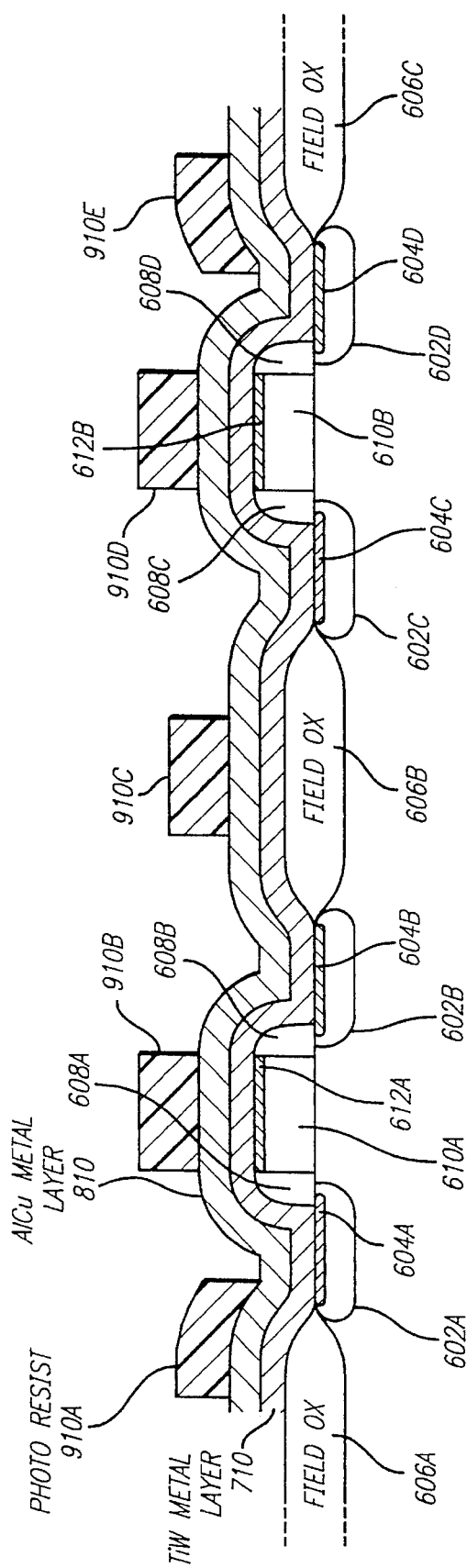
FIG. 9 is a diagram illustrating the critical MI mask to form a local interconnect/strap, a barrier layer, a global interconnect, a strap, and a trim element/fuse according to the present invention.
Figure 10:
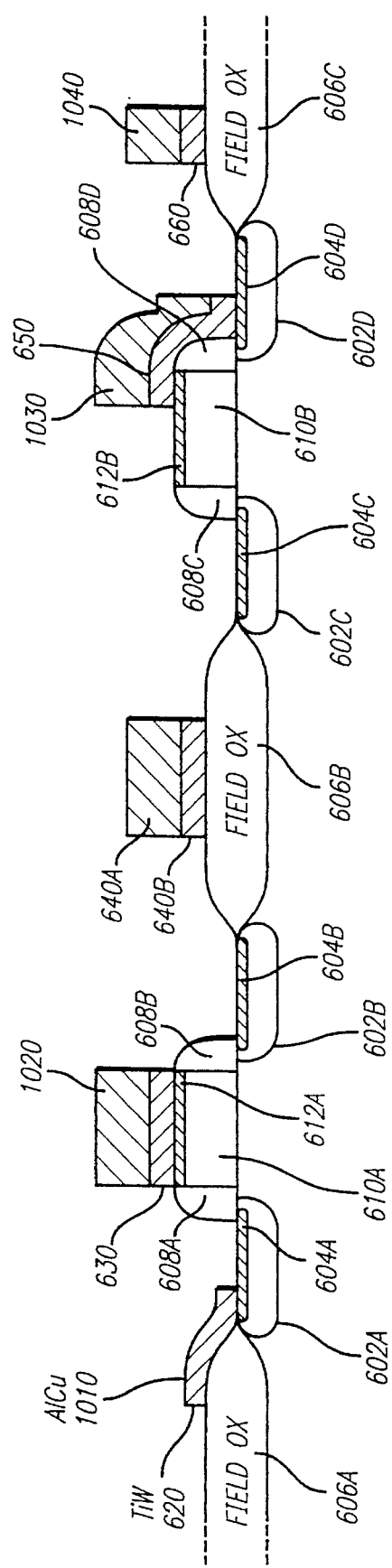
FIG. 10 is a diagram that illustrates etching the AlCu and TiW metal features of mask MI and stripping the photoresist of FIG. 9 according to the present invention.

FIG. 7 illustrates step 1302 of the present invention for sputter depositing a TiW metal film 710 on the device features of FIG. 12. FIG. 8 illustrates step 1304 for sputter depositing an AlCu metal film 810 on the TiW metal layer 710. As indicated in FIGS. 7 and 8, the TiW layer 710 and AlCu layer 810 have nearly uniform thickness throughout each respective film. FIG. 9 illustrates the result of step 1306 for creating a photoresist pattern using the critical MI mask. The photoresist pattern prevents the covered areas of the metal layers from being etched, some of which may be used to form, for example, local interconnect/straps, a barrier layer, a global interconnect, and a fuse/trim element. In the diagram photoresist segments have been created using the process of step 1306. Photoresist segments 910A–910E cover metal layer structures that are used to form a local interconnect/strap, a barrier layer, a global interconnect, a strap, and a trim element/fuse, respectively. FIG. 10 illustrates step 1308 for etching the AlCu and TiW metal features of mask MI and stripping the photoresist 910A–910E of FIG. 9. As described above, the steps of etching and photoresist stripping may be performed in several different sequences. FIG. 10 shows AlCu metal layers 1010, 1020, 640A, 1030, and 1040 and corresponding TiW metal layers 620, 630, 640B, 650, and 660, respectively, after the etch and photoresist strip of step 1308.

Figure 11:
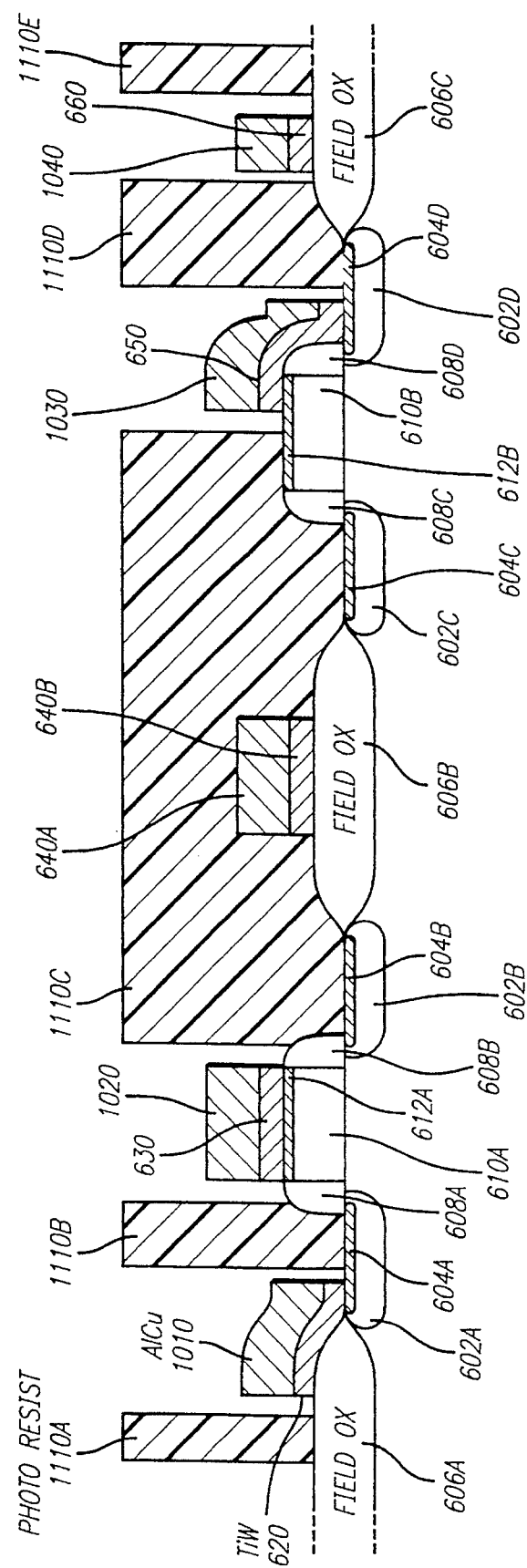
FIG. 11 is a diagram that illustrates the non-critical mask depositing photoresist for subsequent wet etching of AlCu metal according to the present invention.

FIG. 11 illustrates step 1310 for the non-critical mask depositing photoresist 1110A, 1110B, 1110C, 1110D, and 1110E for subsequent wet etching of AlCu in the preferred embodiment. In FIG. 11, the AlCu layer 640A and TiW layer 640B of interconnect 640 are enclosed in photoresist 1110C to prevent AlCu layer 640A from being etched. FIG. 6 illustrates the four device features after step 1312 for etching AlCu layers 1010, 1020, 1030, and 1040 and stripping photoresist 1110A–1110E. As shown in FIG. 6, local interconnect/strap 620 formed from TiW overlaps field oxide 606A and active silicon/silicide areas 602A and 604A. Strap 650 (TiW) overlaps silicide layer 612B, oxide spacer 608D, and silicide layer 604D. Barrier layer 630 (TiW) is deposited on polysilicon/silicide layers 610A and 610B. Global interconnect 640 comprising AlCu layer 640A and TiW layer 640B is deposited on field oxide 606B. Fuse/trim element 660 (TiW) is deposited on field oxide 606C. Step 1314 for depositing intermetal oxide is well-known in the art, and therefore is not illustrated in the diagrams.

In particular, the present invention maintains good barrier (e.g., 630) integrity on polysilicon (e.g., 610A/612A), even as devices are scaled down into the submicron and sub-half micron regimes. The present invention also provides the possibility of a trim element 660, whereas other local interconnect technologies (TiSi$_2$ or TiN) cannot act as trim elements. The present invention further provides area reduction by allowing overlapping contacts (extension of active area onto field oxide) by forming contacts from polysilicon to both n+ and p+ active areas. In comparison, prior art buried contacts require photoresist on gate oxide or use extra area by constructing the contacts in metal 1. Still further, the present invention allows the use of a low resistivity interconnect 640.

In addition, the present invention, significantly improves the manufacturability of technologies such as selective W, which disadvantageously requires depositing a nucleating seed layer into high aspect ratio contacts for contact fill. Prior art methods of maintaining barrier integrity into the submicron/sub-half micron regime require the purchase of new equipment or, at the very least, additional hardware for existing equipment. The present invention for forming barrier layers permits the use of existing equipment, well into the sub-half micron regime, to maintain good barrier integrity. While the prior art is able to fabricate one or, at most, two of the four device features in their technologies, there is not a prior art method for providing all four or even three of these features in one technology. Further, fabrication of three features (i.e., trim elements, local interconnects, and global interconnects) in the prior art requires lithographic performance at the limit of available technology on two levels instead of one, i.e., two critical layers are involved rather than one. Thus, the present invention possesses a number of advantages over the prior art.

Thus, an advantage of the present invention is that it allows the fabrication of all four features in one technology. Another advantage of the present invention is that it provides good barrier integrity, even as devices are scaled into the sub-half micron regime. Still another advantage of the present invention is that it only has one critical lithographic operation. Four device features are built in one layer where all critical lithographic requirements are embodied in a single mask in contrast to the two lithographic steps of the prior art.

A further advantage of the present invention is that it provides higher packing density. Still, a further advantage of the present invention is that it provides fuller utilization of the metal scheme. Yet another advantage of the present invention is that it is more manufacturable as reduced planarization with TiW straps is not a concern. A further advantage of the present invention is that it allows the simultaneous use of one routing layer for lower resistivity global interconnects and a local strap without the prior art requirement for contact isolation and lithography.

Another advantage of the present invention is that a polysilicon layer, the MI metal (e.g., TiW in the preferred embodiment of the present invention), and the metal 1 (e.g., AlCu) layer are all connected using one contact. This provides greater design flexibility because three different wiring or connections in three different levels are connected using only one contact. Still another advantage of the present invention is that devices such as polysilicon resistors can be contacted using MI metal or metal 1, thereby providing improved routing flexibility which provides additional cell size reduction.

In this manner, a method for providing multifunctional, contactless interconnect technology is disclosed.

Claims of the invention:

1. A method for forming a barrier layer structure on a silicon substrate, comprising the steps of:

depositing a single metallization layer comprising a barrier layer film and a metal film on said silicon substrate;

applying a first photoresist layer on said metal film;

exposing a pattern in said first photoresist layer using a first mask wherein a first portion of said first mask has a first mask pattern that forms a first pattern in said first photoresist layer;

wherein said first pattern is for defining said barrier layer structure;

developing said first photoresist layer;

etching said barrier layer film and said metal film to remove first areas of said barrier layer film and said metal film underlying said first pattern, to expose first areas of said silicon substrate and to partially form said barrier layer structure according to said first pattern;

stripping said first photoresist layer to expose second areas of said metal film;

applying a second photoresist layer on said second areas of said metal film and on said first areas of said silicon substrate;

exposing a second layer pattern in said second photoresist layer using a second mask for deeming a region of said second areas of said metal film to be etched;

developing said second photoresist layer to expose said region of said metal film to be removed;

etching to remove said region of said metal film and removing said second photoresist to complete formation of said barrier layer structure.

2. The method of claim 1 wherein said silicon substrate comprises a silicide layer.

3. The method of claim 1 wherein said step of exposing a pattern in said first photoresist layer using a first mask, further comprises exposing a second pattern in said first photoresist layer using a second portion of said first mask, wherein said second pattern defines at least one of a fuse means.

4. The method of claim 3 wherein said step of etching said single metallization layer and removing said first photoresist includes partially forming said fuse means according to said second pattern.

5. The method of claim 1 wherein said step of exposing a pattern in said first photoresist layer using a first mask, further comprises exposing a third pattern in said first photoresist layer using a third portion of said first mask, wherein said third pattern defines at least one of a local interconnect means or strap.

6. The method of claim 5 wherein said step of etching said single metallization layer and removing said first photoresist includes partially forming said local interconnect means or said strap according to said third pattern.

7. The method of claim 1 wherein said silicon substrate comprises a polysilicon layer and said barrier layer film is located on said polysilicon layer.

8. The method of claim 1 wherein said silicon substrate comprises a polysilicon bilayer and said barrier layer film is located on said polysilicon bilayer.

9. The method of claim 1 wherein said silicon substrate comprises a monosilicon area and said barrier layer film is located on said monosilicon area.

10. The method of claim 1 wherein said metal film is an aluminum aloy.

11. The method of claim 1 wherein said metal film is aluminum-copper.

12. The method of claim 1 wherein said metal film is tungsten.

13. The method of claim 1 wherein said barrier layer fihn is a refractory metal.

14. The method of claim 13 wherein said refractory metal is titanium tungsten.

15. The method of claim 1 wherein said step of exposing a pattern in said first photoresist layer using a first mask, further comprises exposing a fourth pattern in said first photoresist layer using a fourth portion of said first mask, wherein said fourth pattern defines at least one of a global interconnect means.

16. The method of claim 15 wherein the step of depositing a second photoresist using a second mask for defining a region of said metal film to be etched comprises the deposition of said second photoresist over said fourth pattern for said global interconnect means.

17. The method of claim 16 wherein said second mask is a non-critical mask.

18. A method for providing interconnects on a silicon wafer, comprising the steps of:

depositing a first metal film on said silicon wafer;

depositing a second metal film on said first metal film;

defining M features in said first and second metal films using a first mask;

etching said first and second metal films to form said M features and removing said first mask;

further defining N of said M features using a second mask, wherein $N \leq M$; and etching said second metal film to form said N features and removing said second mask.

19. The method of claim 18 wherein M is greater than or equal to three.

20. The method of claim 18 wherein said first metal film has constant thickness T.

21. The method of claim 18 wherein said first metal fihn has a higher resistivity than said second metal film.

22. The method of claim 18 wherein said silicon wafer includes a polysilicon layer.

23. The method of claim 22 wherein said N features includes a layer of said first metal formed on said polysilicon layer by said first mask.

24. The method of claim 18 wherein said silicon wafer includes a polysilicon bilayer.

25. The method of claim 24 wherein said N features includes a layer of said first metal formed on said polysilicon bilayer by said first mask.

26. The method of claim 18 wherein said silicon wafer includes a monosilicon layer.

27. The method of claim 26 wherein said N features includes a layer of said first metal formed on said monosilicon layer by said first mask.

28. The method of claim 18 wherein said first metal is a refractory metal.

29. The method of claim 28 wherein said refractory metal is titanium-tungsten.

30. The method of claim 18 wherein said second metal is aluminum-copper.

31. The method of claim 18 wherein said second metal is an aluminum alloy.

32. The method of claim 18 wherein said second metal is tungsten.

33. The method of claim 18 wherein said N features include a trim means.

34. The method of claim 18 wherein said N features include a higher resistivity interconnect means.

35. The method of claim 18 wherein said M features comprise M–N lower resistivity interconnect means.

36. The method of claim 18 wherein said second mask is a non-critical mask.

37. The method of claim 18 including the step of depositing intermetal oxide, after said step of etching said second metal film.

38. A method for providing metallization on a silicon substrate, comprising the steps of:
   forming a first metal layer on a region of a silicon substrate;
   forming a second metal layer on said first metal layer;
   defining a first plurality of features in said first and second metal layers including at least one barrier layer using a first photomasking technique and a first photoresist applied to said second metal layer;
   selectively stripping said second metal layer and said first metal layer according to said first photoresist;
   removing said first photoresist;
   defining a second plurality of features in said first metal layer using a second photomasking technique and a second photoresist applied to said second metal layer, said second plurality of features less than or equal to said first plurality of features;
   selectively removing said second metal layer according to said second photoresist; and
   removing said second photoresist to provide said second plurality of features including said at least one barrier layer.

39. The method of claim 38 wherein said first metal layer is a refractory metal layer.

40. The method of claim 39 wherein said refractory metal layer is a titanium-tungsten layer.

41. The method of claim 38 wherein said second metal layer is an aluminum-copper layer.

42. The method of claim 38 wherein said second metal layer is an aluminum alloy layer.

43. The method of claim 38 wherein said second metal layer is a tungsten layer.

44. The method of claim 38 wherein said first plurality of features includes at least one higher resistivity interconnect means.

45. The method of claim 38 wherein said first plurality of features includes at least one lower resistivity interconnect means.

46. The method of claim 38 wherein said first plurality of features further includes at least one trim means.

47. The method of claim 38 including the step of depositing intermetal oxide, after said step of removing said second photoresist.

48. A method for providing multifunctional, contactless interconnect technology on a silicon wafer, said silicon wafer comprising a polysilicon layer, said method comprising the steps of:
   sputter depositing a first metal film on said silicon wafer;
   sputter depositing a second metal film on said first metal film;
   defining four metal features in said first and second metal films, said four metal features comprising a barrier layer, said barrier layer located on said polysilicon layer using a first mask;
   etching said first and second metal films to at least partially form said four features and removing said first mask;
   further defining three of said four features in said first metal film using a second mask; and
   etching said second metal and removing said second mask to provide said three of said four features.

49. The method of claim 48 wherein said first metal is a refractory metal.

50. The method of claim 49 wherein said refractory metal is titanium-tungsten.

51. The method of claim 48 wherein said second metal is aluminum-copper.

52. The method of claim 48 wherein said second metal is an aluminum alloy.

53. The method of claim 48 wherein said second metal is tungsten.

54. The method of claim 48 wherein one of said four features includes a trim means.

55. The method of claim 48 wherein one of said four features includes a higher resistivity interconnect means.

56. The method of claim 48 wherein one of said four features includes a lower resistivity interconnect means.

57. The method of claim 48 wherein said second mask is a non-critical mask.

58. The method of claim 48 wherein said three of said four features includes a higher resistivity interconnect means.

59. The method of claim 48 wherein said three of said four features includes a barrier layer.

60. The method of claim 48 wherein said three of said four features includes a trim means.

61. The method of claim 48 including the step of depositing intermetal oxide, after said step of etching said second metal film.

62. A method for forming metal layer structures comprising the steps of:
   applying a first metal layer on a semiconductor substrate;
   applying a second metal layer on said first metal layer;
   applying a first photoresist layer on said second metal layer;
   exposing a first pattern in said first photoresist layer using a first mask;
   developing said first photoresist layer;
   etching said first metal layer and said second metal layer to remove first areas of said first metal layer and said second metal layer underlying said first pattern and to expose first areas of said semiconductor substrate;
   stripping said first photoresist layer to expose second areas of said second metal layer;
   applying a second photoresist layer on second areas of said second metal layer and on first areas of said semiconductor substrate;
   exposing a second pattern in said second photoresist layer using a second mask;
   developing said second photoresist layer to expose third areas of said second metal layer;
   etching said second metal layer to remove said third areas of said second metal layer and to expose third areas of said first metal layer.

63. The method of claim 62 wherein said step of etching said first metal layer and said second metal layer comprises the step of forming components in said first metal layer of at least two types of structures.

64. The method of claim 62 wherein said step of etching said first metal layer and said second metal layer further comprises the step of forming components in said first metal layer of at least three types of structures.

65. The method of claim 62 wherein said step of etching said first metal layer and said second metal layer further comprises the step of forming components in said first metal layer of four types of structures.

66. The method of claim 63 wherein said step of forming said components in said first metal layer of at least two types of structures comprises the step of forming a component in said first metal layer of a barrier structure.

67. The method of claim 66 wherein said step of forming said components in said first metal layer of at least two types of structures further comprises the step of forming a component in said first metal layer of a global interconnect structure.

68. The method of claim 67 wherein said step of forming said components in said first metal layer of at least two types of structures further comprises the step of forming a component in said first metal layer of a local interconnect structure.

69. The method of claim 68 wherein said step of forming said components in said first metal layer of at least two types of structures further comprises the step of forming a component in said first metal layer of a fuse structure.

70. The method of claim 65 wherein said step of forming said components in said first metal layer of four types of structures comprises forming a component in said first metal layer of a barrier structure, a component in said first metal layer of a global interconnect structure, a component in said first metal layer of a local interconnect structure, and a component in said first metal layer of a fuse structure.

* * * * *